(12) United States Patent
Feurer et al.

(10) Patent No.: US 9,027,240 B2
(45) Date of Patent: May 12, 2015

(54) METHOD FOR PRODUCING A FLEXIBLE CIRCUIT CONFIGURATION

(75) Inventors: Ernst Feurer, Blaustein (DE); Bruno Holl, Ulm (DE); Alexander Kaiser, Schemmerhofen (DE); Karin Ruess, Stuttgart (DE)

(73) Assignee: Cicor Management AG, Zürich (CH)

(*) Notice: Subject to any disclaimer, the term of this patent is extended or adjusted under 35 U.S.C. 154(b) by 711 days.

(21) Appl. No.: 12/896,403

(22) Filed: Oct. 1, 2010

(65) Prior Publication Data

US 2011/0272180 A1    Nov. 10, 2011

(30) Foreign Application Priority Data

May 4, 2010   (DE) .................. 10 2010 016 780

(51) Int. Cl.
| | |
|---|---|
| *H01K 3/10* | (2006.01) |
| *H05K 3/00* | (2006.01) |
| *H05K 3/42* | (2006.01) |
| *H05K 1/03* | (2006.01) |

(52) U.S. Cl.
CPC ............ *H05K 3/0097* (2013.01); *H05K 1/0393* (2013.01); *H05K 3/0035* (2013.01); *H05K 3/0052* (2013.01); *H05K 3/421* (2013.01)

(58) Field of Classification Search
CPC ... H05K 3/421; H05K 3/0097; H05K 1/0393; H05K 3/0035; H05K 3/0052

USPC .................. 29/830, 831, 832, 841, 846, 852; 216/65; 427/97.2; 438/107, 112, 125, 438/598

See application file for complete search history.

(56) References Cited

U.S. PATENT DOCUMENTS

| | | | |
|---|---|---|---|
| 5,048,179 A | | 9/1991 | Shindo et al. |
| 5,527,741 A | * | 6/1996 | Cole et al. ........................ 29/832 |
| 6,027,958 A | | 2/2000 | Vu et al. |
| 6,217,972 B1 | | 4/2001 | Beroz et al. |
| 6,255,137 B1 | * | 7/2001 | Gorczyca et al. ............. 438/112 |
| 2006/0231837 A1 | | 10/2006 | Wuchse et al. |
| 2007/0241201 A1 | | 10/2007 | Brown et al. |
| 2009/0000808 A1 | | 1/2009 | Yang |
| 2009/0223700 A1 | * | 9/2009 | Youngner et al. ............. 174/254 |

* cited by examiner

*Primary Examiner* — Donghai D Nguyen
(74) *Attorney, Agent, or Firm* — McCormick, Paulding & Huber LLP

(57) ABSTRACT

For the production of a flexible circuit configuration, which contains a layer sequence and a film connected thereto, for the creation of through contacts through the film up to terminal surfaces of the layer sequence, it is proposed that the film be connected unstructured to the layer sequence provided in a defined position on the substrate and then, while the composite of layer sequence and film remains on the substrate, perforations be created through the film up to terminal surfaces of a conductive layer of the layer sequence and contact metal be deposited in structured form on the film and in the perforations as through contacts.

13 Claims, 3 Drawing Sheets

METHOD FOR PRODUCING A FLEXIBLE CIRCUIT CONFIGURATION

CROSS REFERENCE TO RELATED APPLICATIONS

This patent application claims priority of the German patent application No. DE 102010016780.0, filed on 4 May 2010. The entire content of this priority defining application is incorporated herein by explicit reference for any purpose.

There are two related co-pending US applications which are filed on the same day as the present application. The first entitled METHOD FOR PRODUCING A FLEXIBLE CIRCUIT CONFIGURATION claims the priority of the German patent application No. DE 102010016779.7, filed on 4 May 2010. The second entitled METHOD FOR PRODUCING A FLEXIBLE CIRCUIT CONFIGURATION claims the priority of the German patent application No. DE 102010016781.9, filed on 4 May 2010.

FIELD OF THE INVENTION

The invention relates to a method for producing a flexible circuit configuration, a flexible circuit configuration, and an electrical circuit configuration having such a flexible circuit configuration.

BACKGROUND OF THE INVENTION

Flexible circuit configurations are advantageous, inter alia, for use in applications in which the circuit configuration must have permanent flexible properties, in particular in the case of body implants or in objects which have at least limited flexibility in use, such as credit cards.

Flexible circuit configurations contain at least one insulating layer and at least one conductive layer, at least the conductive layer being structured in the surface. The terms insulating layer and conductive layer refer in this case and hereafter to the electrical properties of the layer materials. At least two structured conductive layers are frequently provided, which are spaced apart from one another by an insulating layer acting as a separation layer. The two conductive layers are typically conductively connected to one another in spots via through contacts through the separation layer, which is also structured in the surface for this purpose, so that a three-dimensional configuration of conductor structures arises. The structuring of the conductive layers and the insulating layers is typically performed by photolithography using various masks.

Terminal surfaces are implemented in the conductor structures in at least one structured conductive layer of the flexible circuit configuration to connect the flexible circuit configuration to a further circuit configuration containing conductor paths, components, etc., in particular to a circuit board.

SUMMARY OF THE INVENTION

The present invention is based on the object of specifying a method for the cost-effective production of flexible circuit configurations having very small structures. The object of the invention is further a flexible circuit configuration which is produced according to such a method and an electrical circuit configuration having such a flexible circuit configuration.

Solutions according to the invention are described in the independent claims. The dependent claims contain advantageous embodiments.

By connecting an unstructured carrier film to the layer sequence of the flexible circuit configuration and subsequently creating structures and through contacts through the carrier film, flexible circuit configurations having very small structure sizes of the structures may be created particularly cost-effectively. In the flexible circuits produced according to the method according to the present invention, the fundamental flexibility of the layer sequence is maintained, but the handling capability during the further use of the flexible circuit configurations is substantially improved with respect to the purely flexible structured layer sequence.

The subsequent structuring of a carrier film, which was previously connected in unstructured form to the layer sequence, is particularly of special advantage with respect to a procedure using pre-structuring of the carrier film and connection of the pre-structured carrier film to the layer sequence. The process control can be kept simple by the unstructured carrier film, which is connected to the layer sequence, and can be restricted to a few processing steps, which are executable at high precision, after the finishing of the layer sequence. This results overall in a cost-effective production, in particular in the composite of a plurality of flexible circuit configurations, which may be produced simultaneously on a common substrate.

Through the connection of the unstructured carrier film to the layer sequence and the following creation of the perforations and through contacts through the carrier film in a method stage in which the unstructured film is connected to the layer sequence, in relation to pre-structuring of the carrier film using through contacts and connections of the structured carrier film to the layer sequence, flaws are extensively prevented in the connections between carrier film and layer sequence, in particular flaws due to inadequate alignment precision.

This is based on the finding, inter alia, that the carrier film, which typically comprises a polymer, in particular a polyimide, can be pre-finished with high precision of the positions of the through contacts and contact surfaces, but, on the one hand, an orientation error of the pre-structured carrier film upon application on the layer sequence is unavoidable and, on the other hand, distortions of the carrier film occur during its handling due to mechanical and/or thermal influences. At the small dimensions of the terminal surfaces of only fractions of millimeters, cumulative position deviations, which result in malfunctions, thus arise between contact surfaces on the inner side of the carrier film and terminal surfaces of the layer sequence. The electrical connections between contact surfaces and terminal surfaces are also problematic.

Orientation flaws are extensively prevented in the method according to the invention. In particular, the same position references of a manufacturing device, which were also used during the structuring of the terminal surfaces in the conductor structure of the layer sequence, may be used for the structuring of the carrier film during the creation of the perforations and the production of the through contacts and the contact surfaces. Such position references are given, for example, by reference marks on the rigid substrate or on the substrate holder, by formfitting interlocking structures between the substrate and a substrate holder, or the like. The use of uniform position references in successive manufacturing steps is fundamentally known and typical, in particular during the production of the layer sequence itself.

The layer sequence is advantageously created on a rigid substrate and after finishing of the flexible circuit configuration, in which the layer sequence and the carrier film are connected to one another and the through contacts and contact surfaces are implemented, is separated from the substrate. A plurality of flexible circuits can advantageously be produced jointly in a planar composite adjacent to one another for efficient and cost-effective production. The flexible circuit configuration can be situated on a circuit board and can be electrically connected via the contact surfaces to conductor paths of the circuit board. The flexible circuit configuration can be supplemented, also in the composite, with additional electrical components on its surface before the isolation.

In a preferred embodiment, the substrate has a continuous level surface, on which the individual layers of the layer sequence are successively deposited and structured if provided. The rigid substrate can have reference structures for orientation of devices for structuring, for example, photolithography masks, or can be connected to a device, such as a sample table, having such reference structures in a defined position, which is preferably uniform or reproducible over successive method steps. The devices for structuring may also contain a movable, numerically controllable tool carrier, for example.

At least one structured conductive layer having terminal surfaces in the conductor structures is provided in the layer sequence deposited on the planar substrate. The terminal surfaces are used for the electrical connection of the conductor structures of the one or more conductive layers of the layer sequence. The terminal surfaces are preferably produced as conductor structures in the conductive layer deposited as the last conductive layer in the layer sequence, which will be referred to hereafter as the terminal layer to differentiate from further conductive layers possibly provided in the layer sequence. An insulating layer is preferably also deposited on the terminal layer, which will be referred to hereafter as the cover layer. The carrier film is flatly connected to the cover layer, in particular laminated thereon. The cover layer can advantageously remain flatly continuously unstructured for the connection to the carrier film. However, terminal surfaces may also be created through the cover layer.

The carrier film can be constructed per se by multiple layers and/or multiple partial films. In particular, the carrier film can be formed by a first and a second partial film, the first film facing toward the layer sequence being implemented as an adhesive film, which can advantageously be subjected to an elevated temperature for gluing to the layer sequence and to the second partial film. The second partial phone can advantageously be a more mechanically stable reinforcement film, in particular made of an FR4 material.

After the carrier film is connected to the cover layer of the layer sequence, the layer sequence being held unchanged on the rigid substrate, perforations are created through the carrier film up to the terminal surfaces at the positions of the terminal surfaces of the terminal layer. If the cover layer of the layer sequence runs unstructured over the terminal surfaces, the perforations created in the carrier film are also continued through the cover layer up to the terminal surfaces.

The carrier film and the cover layer advantageously comprise a polymer, in particular a polyimide. The terminal surfaces, in particular the entire conductor structures of the terminal layer, advantageously comprise metal, in particular copper or gold. Intermediate layers may be deposited at interfaces between various layers, in order to ensure the mechanical and/or electrical connection between two layers.

The creation of the perforations through the carrier film and optionally the cover layer up to the terminal surfaces can advantageously be performed by application in spots of a focused laser beam to the carrier film at the positions of the terminal surfaces. The parameters of the laser beam are advantageously selected so that the polymer material is ablated by the energy introduction, while in contrast the metal lying underneath of the terminal surfaces is not attacked. Parameters of the laser beam may be the wavelength in particular, in addition to the intensity. A $CO_2$-laser can be used in an advantageous embodiment.

Through contacts are created in the perforations extending up to the terminal surfaces, a metal layer preferably being deposited as a contact material over the entire area on the outer side facing away from the layer sequence and being structured, for example, by subsequent photolithographic masking and selective removal or by prior photolithographic structuring of a photoresist and lift-off of excess metal or being created by selective, in particular galvanic deposition of metal in a resist mask as a structured metal layer. The contact material can be deposited in particular by sputtering and possible galvanic reinforcement of a base layer. Such methods for creating structured metal layers are known per se.

A particularly good electrical connection, having long-term stability, of the through contacts to the terminal surfaces advantageously results during the creation of the through contacts through the previously created perforations using metal deposition. Contact material is preferably deposited jointly with the contact material of the through contacts in the perforations for the contact surfaces provided on the outer side of the carrier film. Before the contact material is deposited, a preferably conductive intermediate layer, e.g., completely or partially made of titanium, can be deposited as an adhesion promoter layer.

The flexible circuit configuration is separated from the substrate after creation of the through contacts and contact surfaces, in the case of simultaneous creation of a plurality of flexible circuits in the composite over a common substrate, the individual flexible circuit configurations preferably being separated from one another while they are still situated on the substrate, for example, by creating grooves forming the contours of the individual flexible circuits through the carrier film and through the layer sequence up to the substrate. Between finishing of the through contacts and the contact surfaces, on the one hand, and separation of the flexible circuit configurations from the substrate, on the other hand, still further processing steps may be performed while the flexible circuit configurations remain on the substrate.

In another embodiment, instead of a rigid substrate having a closed surface, on which the layer sequence is deposited, a rigid frame around a substrate forming a free inner surface can also be selected, on which a base film spanning the inner surface is fastened. The layer sequence of the flexible circuits having the at least partially structured insulating and conductive layers is advantageously created on the base film over the inner surface, photolithographic methods advantageously again being able to be used for the structuring.

After finishing of the layer sequence, a carrier film can again be connected using its side facing away from the base film and provided in the way described with the perforations and contact surfaces, before the flexible circuit configuration is cut out of the area spanning the inner surface and isolated, optionally after further method steps.

In a refinement, the base film spanning the inner surface of a rigid substrate frame, on which the layer sequence for the flexible circuit configuration is deposited over the inner surface, is also used as a carrier film. The layer sequence for the flexible circuit is deposited on the base film for this purpose in the reverse sequence of the individual layers, in particular having the terminal layer as the structured conductive layer closest to the base film. The terminal layer containing the terminal surfaces can also be deposited directly on the base film. The creation of through contacts through the base film and the production of the through contacts and contact surfaces is performed from the side of the base film facing away from the layer sequence.

The individual layers of the base film may each preferably be created as materially-homogeneous layers per se, but may also be constructed from partial layers. In particular, intermediate layers may be provided as adhesion-promoting layers at interfaces to adjacent layers. For example, an intermediate layer containing titanium (Ti) can be provided at interfaces between metal layers and polymer layers, which improves the adhesion between metal layer and polymer layer.

BRIEF DESCRIPTION OF THE DRAWINGS

The invention is explained in greater detail hereafter on the basis of preferred exemplary embodiments with reference to the figures. In the figures.

Coordinates of a perpendicular x-y-z coordinate system are also shown in some of the figures.

The figures are only to be understood as schematic explanations and are not to scale in the relative dimensions.

DESCRIPTION OF THE PREFERRED EMBODIMENTS

Figure 1:
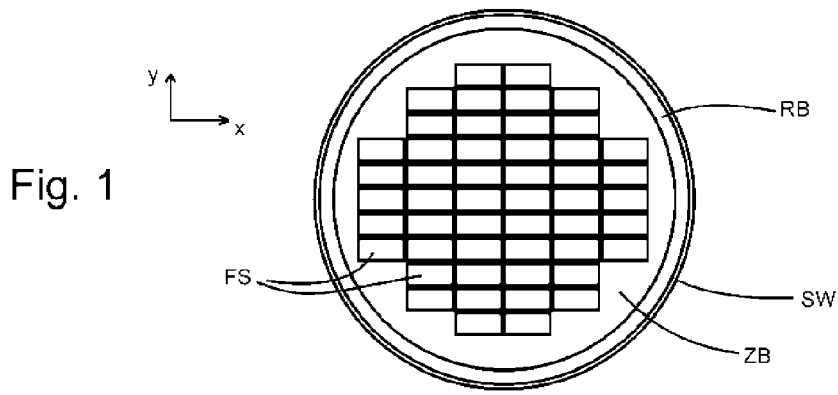
FIG. 1 shows a top view of a substrate having a plurality of flexible circuits.

FIG. 1 shows a configuration having a rigid substrate SW, such as a silicon wafer, having a plurality of flexible circuit configurations FS. The flexible circuit configurations FS, which are assumed to be identical to one another in the outlined example, are formed by a layer sequence over the substrate SW and are situated in a regular raster in a central area ZB of the layer sequences over the substrate SW. The central area ZB is enclosed by a peripheral edge area RB. Advantageously, at least one of the layers of the layer sequence runs via both the edge area RB and also via the central area ZB enclosed thereby over the substrate SW. The position specification that the layer sequence runs over the substrate is to be understood to mean that the layers of the layer sequence, in the direction of the surface normals of the plane or surface of the substrate SW, follow this substrate surface directly or over previously created layers.

The multiple flexible circuits FS form a regular raster in the central area in the example according to FIG. 1, which is only to be understood as exemplary, however. The multiple flexible circuits FS may also be different from one another and/or may be situated irregularly on the substrate surface.

The side of the substrate facing toward the layer sequence of the substrate, also referred to hereafter as the upper side of the substrate, is assumed to be lying in an x-y plane. The surface normals of the substrate surface run parallel to the z direction of the perpendicular coordinate system. It is assumed hereafter as an approximation for the flexible circuit configurations that all planar components, in particular flexible films and individual layers of the layer sequence, also run smoothly parallel to the substrate surface. Because of the structuring of individual layers of the layer sequence, it may have deviations from the exact smooth course in the magnitude of the layer thicknesses, which can be viewed as negligible for the present invention because of the very low layer thickness in relation to the transverse dimensions. Therefore, an essentially smooth course of the individual layers or films of the structure of the flexible circuit configuration parallel to a x-y plane is assumed hereafter, as long as the flexible circuit configuration is connected to the substrate.

Figure 2:
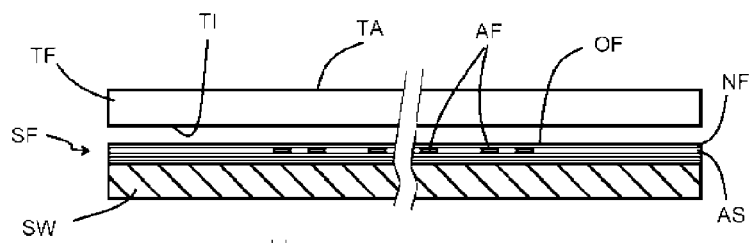
FIG. 2 shows side views of FIG. 1.
Figure 2:
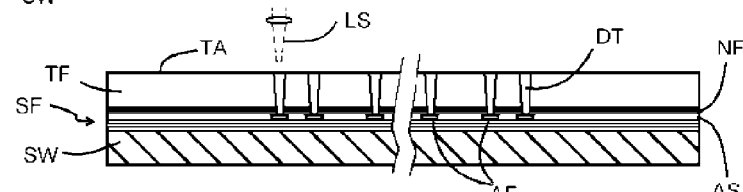

FIG. 2 shows two partial views of a first preferred embodiment of the invention, in FIG. 2(A), a layer sequence SF, which is created on a planar continuous substrate SW, and a carrier film TF being shown separately. In FIG. 2(B), the carrier film TF is flatly connected to the surface OF of the layer sequence, in particular laminated on, and structured.

The substrate SW forms a rigid foundation for the layer sequence SF. The layer sequence contains at least one structured conductive layer AS, in which, inter alia, terminal surfaces AF are implemented. The structured conductive layer AS having the terminal surfaces AF is covered by an insulating layer NF as a cover layer. The insulating layer NF is not structured and forms the free surface OF of the layer sequence held on the substrate SW.

The layer sequence SF can contain multiple insulating layers and multiple conductive layers in a preferred embodiment, the conductive layers preferably being structured flatly. Advantageously, in a typical way known per se, multiple conductive layers are electrically connected to one another via through contacts through insulating layers separating these conductive layers. For this purpose, the conductive layers are also flatly structured. Flat structuring is understood here to mean that a layer is not implemented as continuously flat, but rather the layer material can have structures such as conductor paths, terminal surfaces, and through contacts in the case of conductive layers, or surface perforations to form through contacts in the case of insulating layers. The structuring is known to those skilled in the art by various typical, in particular photolithographic methods.

The carrier film TF has a side TI, which points toward the surface OF of the layer sequence SF and is referred to hereafter as the inner side, and an outer side TA, facing away from the layer sequence SF. The carrier film TF is laid using its inner side TI on the surface OF of the layer sequence and connected to the layer sequence. The layer sequence is held in unchanged position on the substrate SW, so that the positions of the terminal surfaces AF in the conductive layer AS of the layer sequence are also precisely known. The carrier film can be constructed as multilayered per se.

Perforations DT are subsequently created in the carrier film TF connected to the layer sequence SF, which reach through the carrier film TF up to the terminal surfaces AF. In the outlined case, in which the terminal surfaces AF are covered within the layer sequence by an insulating cover layer NF, the perforations are continued through the carrier film through this cover layer NF up to the terminal surfaces AF. The perforations DT are created in a preferred embodiment by action of a focused laser beam LS, which can be positioned precisely in the x and y directions. The parameters of the laser beam, such as intensity or wavelength in particular, are selected so that the polymer material, in particular polyimide, of carrier film TF and cover layer NF is ablated, but the preferably metal terminal surfaces AF are not attacked.

Through contacts from the terminal surfaces AF to the contact surfaces to be created on the upper side TA of the carrier film can be produced in the perforations DT, as explained below in detail.

Because the layer sequence SF remains uninterrupted on the substrate SW, the perforations DT can be created through the carrier film TF with high precision, i.e., at the x-y positions of the terminal surfaces AF.

FIG. 3 again shows in two steps an embodiment in which the substrate does not have a continuous surface, but rather forms a rigid substrate frame SR, which peripherally encloses an area IF, which is referred to hereafter as the inner surface and is enclosed by the frame SR.

A base film GF, preferably made of a polymer, in particular a polyimide, is fastened, preferably glued onto the rigid substrate frame SR. The inner surface enclosed by the substrate frame SR is freely spanned by the base film GF. The base film GF typically has a thickness between at least 0.01 mm, in particular at least 0.03 mm, and at most 0.2 mm, in particular 0.1 mm. The thickness of the substrate frame SR in the z direction is advantageously between 0.5 mm and 5 mm. The width of the frame between its outer contour and inner surface IF is advantageously at least 3 times the thickness of the frame.

The substrate frame SR can advantageously be produced in that an inner part having the inner contour of the substrate frame is cut out of a continuous plate having the outer contour of the substrate frame. In subsequent processing steps, the inner part can form a supporting underlay for the spanning area of the base film over the inner surface, without the base film being connected to this inner part.

A layer sequence SF is again deposited on the base film GF which, as in the example according to FIG. 2, contains, inter alia, a structured conductive layer AS having terminal surfaces AF and an insulating layer NF, which covers these terminal surfaces, having a surface OF. A carrier film TF of the type already described in FIG. 2 is in turn connected to the surface OF of the layer sequence SF, in particular glued on, and perforations DT are again created through the carrier film up to the terminal surfaces AF from the outer side TA of the carrier film TF. The base film is advantageously supported on the area of the inner surface.

Figure 3:
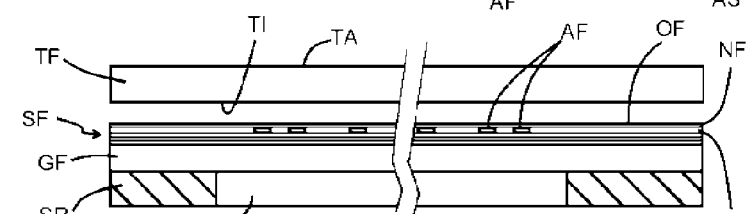
FIG. 3 shows an embodiment having a film over a substrate frame.
Figure 3:
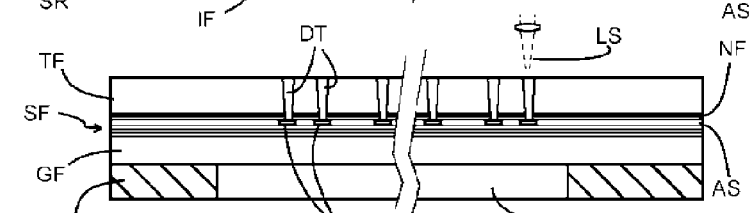
Figure 4:
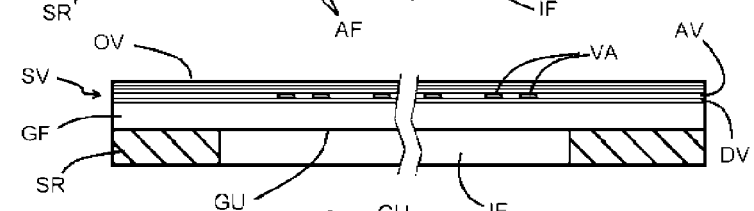
FIG. 4 shows a variant of FIG. 3.
Figure 4:
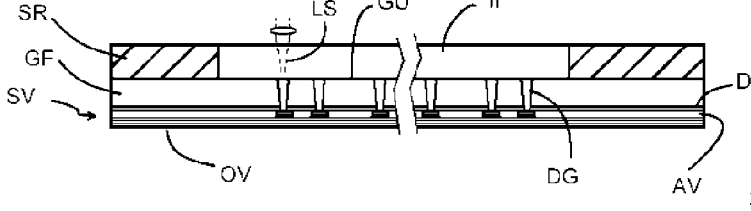

FIG. 4 shows a variant of FIG. 3, in which a base film GF is again fastened on a substrate frame SR, which spans the inner surface enclosed by the substrate frame. The layer sequence SV deposited on the base film GF in this variant provides terminal surfaces VA in a conductive layer AV close to the base film GF, so that the sequence of the layers of the layer sequence SV typically runs in reverse to the sequence of the layers of the layer sequence SF.

In the variant according to FIG. 4, no additional carrier film is applied to the side of the layer sequence facing away from the substrate. To produce through contacts to the terminal surfaces VA of the layer sequence, which are close to the base film in this case, perforations DG are produced through the base film and optionally one or more insulating layers of the layer sequence SV from the lower side GU of the base film GF. For this purpose, a bundled laser beam LS can again be used, as indicated in FIG. 4(B).

After finishing of the circuit configurations, they may be separated from one another, for example, using a laser beam or a cutting tool, and used further individually. Further steps of a production method may be provided between the production of through contacts through the carrier film or base film and the separation and isolation of the multiple flexible circuit FS from the composite according to FIG. 1, equipping of contact surfaces of the flexible circuits with additional components also being able to be provided, for example.

Figure 5:
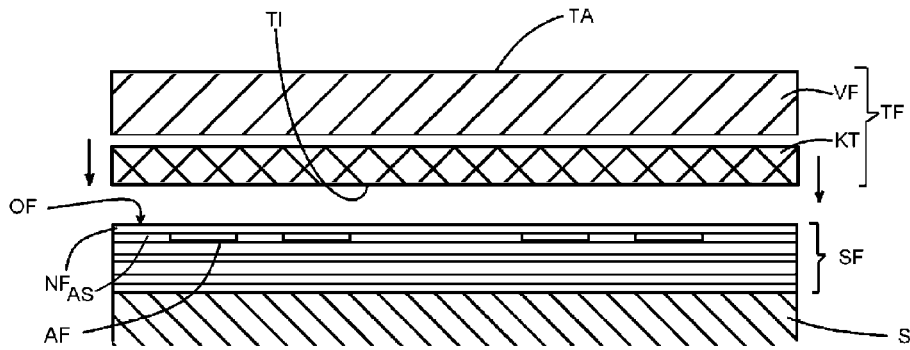
FIG. 5 shows an enlarged detail of FIG. 2(A)
Figure 6:
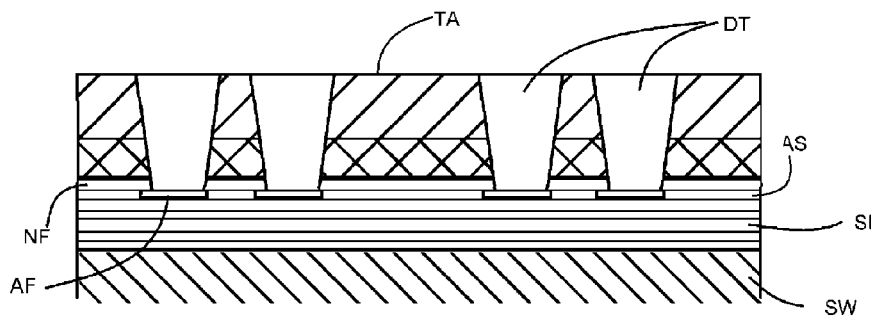
FIG. 6 shows the creation of perforations through the carrier film.
Figure 7:
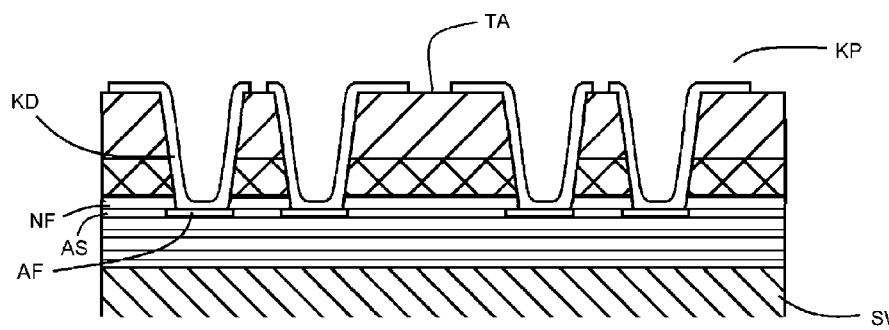
FIG. 7 shows the production of through contacts and contact surfaces.

The production of a flexible circuit configuration having externally accessible contact surfaces in the preferred embodiment according to FIG. 2 is shown in greater detail in FIG. 5 through FIG. 7.

In the illustration according to FIG. 5, a layer sequence NF having multiple insulating layers and conductive layers is already deposited on the rigid substrate SW. Terminal surfaces AF are created from the material of the conductive layer in the structured conductive layer AS. Metal, in particular copper or gold, is advantageously used as the material of the conductive layer. An insulating layer NF is deposited over the structured conductive layer AS, whose surface OF forms the upper side of the layer sequence SF facing toward the carrier surface TF.

The carrier film TF, which, in a circuit composite as in FIG. 1, extends uniformly over the entire surface area of all flexible circuits FS, typically over the entire substrate surface, is formed in the preferred outlined example from two partial films and contains an adhesive film KT facing toward the layer sequence SF, as the first partial film, and a reinforcement film VF facing away from the layer sequence, as the second partial film. The side of the first film facing toward the layer sequence is referred to as the inner side TI of the carrier film TF, and the side of the second film facing away from the layer sequence is referred to as the outer side TA of the carrier film TF. The reinforcement film VF can also be implemented as an adhesive film.

After connection of the carrier film TF to the layer sequence SF, perforations DT are created through the carrier film TF, preferably using a focused laser beam from the outer side TA of the carrier film TF facing away from the layer sequence SF. These perforations DT are also continued through the insulating layer NF of the layer sequence up to the terminal surfaces AF of the structured conductive layer AS of the layer sequence. By depositing an electrically conductive contact material, in particular a metal, preferably copper or gold, through contacts KD are created in the perforations DT and contact surfaces KP are created on the outer side TA of the carrier film TF by structuring of the deposit of the contact material. The through contacts KD form electrical connections between the terminal surfaces AF of the conductive layer AS and the contacts KP on the outer side of the carrier film. Through the production of the through contacts KD by metal deposition, in particular sputtering and galvanic reinforcement of metal, a particularly reliable electrical and mechanical connection of the through contacts KD to the terminal surfaces AF is achieved. The through contacts KD merge in a homogeneous material into the contact surfaces KP in the case of the preferred simultaneous creation thereof. Since during both the structuring of the carrier film TF for creating the perforations DT and also the contact metal deposition for creating the contact surfaces KP, carrier film and layer sequence SF are situated in unchanged position on the substrate SW, both the perforations DT and also the contact surfaces KP and the through contacts KD, which are coherent therewith, may be produced with high precision with respect to the x-y positions of the terminal surfaces AF of the conductive layer AS.

Figure 8:
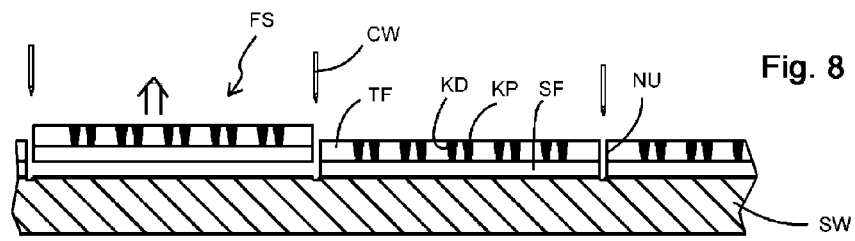
FIG. 8 shows the detachment of a flexible circuit from the substrate.
Figure 9:
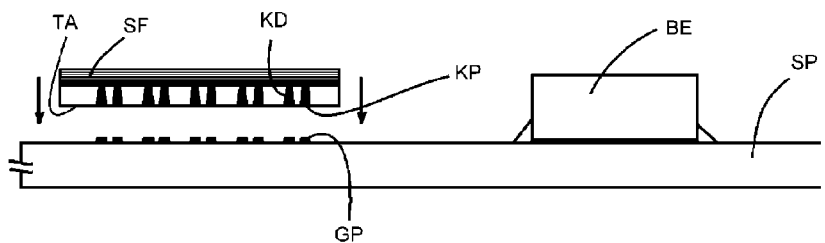
FIG. 9 shows the connection of a flexible circuit to a circuit board.

After finishing of the flexible circuit configuration in the composite shown in FIG. 1, they may be separated from one another, for which purpose laser beams or, as indicated in FIG. 8, cutting tools CW create grooves NU from the upper side TA of the carrier film TF up to the substrate SW. The flexible circuits FS may then be detached in isolated form from the substrate SW, as indicated on the left in FIG. 8 for one of the flexible circuits by lifting off in the direction of the double arrow.

In another embodiment, the substrate SW can also be completely cut through at the positions of the grooves NU and the flexible circuit configurations FS can then remain connected to parts of the substrate for the further handling and only be detached later from the substrate as isolated flexible circuit configurations.

The flexible circuit configuration isolated in this manner can be used further in particular as a component of an electrical circuit configuration on a circuit board SP, for which purpose the flexible circuit configuration is applied to the circuit board SP having the outer side TA facing toward the circuit board SP and is connected thereto, the contact surfaces KP of the flexible circuit configurations being electrically connected to counter surfaces GB on the circuit board SP. The circuit board SP can typically contain still further passive or active components BE, a battery, etc.

Figure 10:
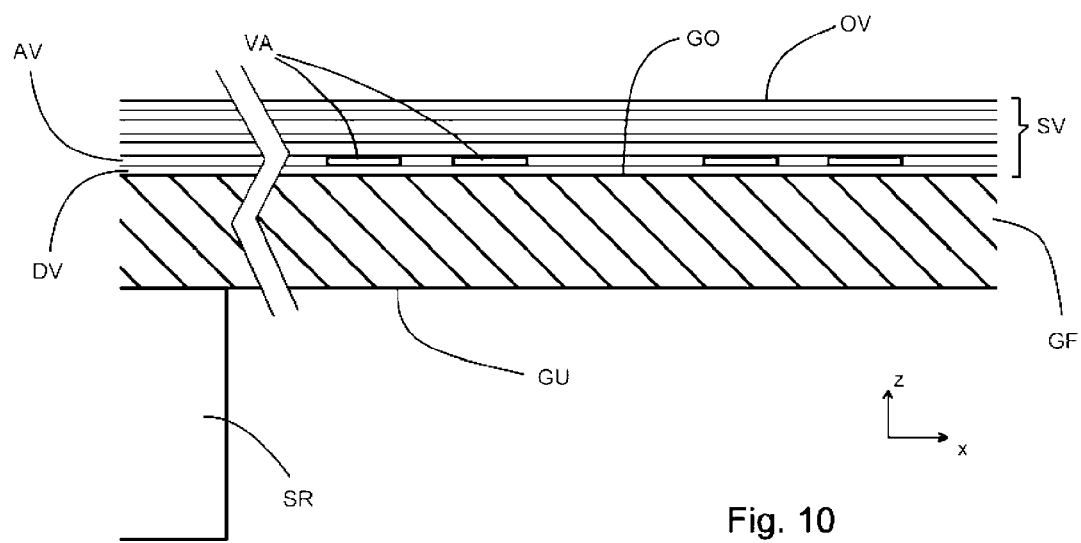
FIG. 10 shows an enlarged detail of FIG. 4.

The variant shown in FIG. 4 is outlined in greater detail in FIG. 10, in which a layer sequence SV is created on a base film GF spanning a substrate frame SR. The layer sequence SV again contains at least one structured conductive layer in which terminal surfaces VA are implemented, typically adjacent to other structures. The terminal surfaces VA are separated in the example outlined in FIG. 10 by an insulating first layer DV of the layer sequence SV from the upper side GO of the base film GF, which faces toward the layer sequence. The insulating layer DV is preferably not structured. The conductive layer AV of the terminal surfaces VA can also be deposited directly on the upper side GO of the base film.

Figure 11:
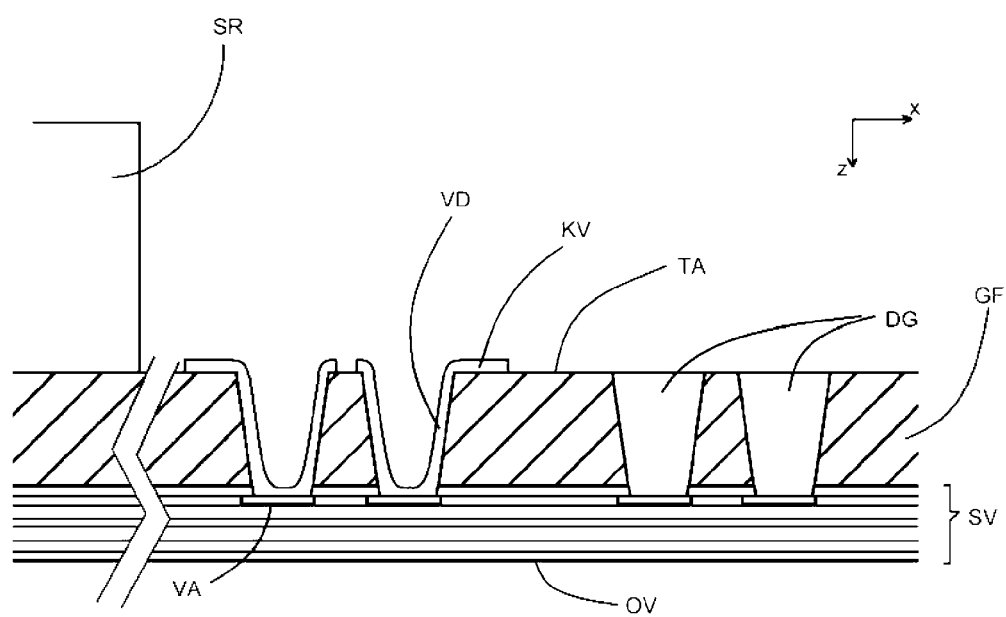
FIG. 11 shows the configuration according to FIG. 10 having through contacts.

Starting from the finished state according to FIG. 10 having finished layer sequence SV, perforations DG are created through the base film GF from the lower side GU of the base film GF facing away from the layer sequence, these perforations DG also extending through the first insulating layer DV of the layer sequence SV up to the terminal surfaces VA of the layer sequence SV. On the lower side GU facing away from the layer sequence SV, which faces upward in FIG. 11, a structured conductive layer forming the contact surfaces KV, in particular a metal layer, is created, which advantageously, as in the preceding example, also simultaneously forms the through contacts VD from the contact surfaces KV to the terminal surfaces VA. Different method stages before and after creation of the contact surfaces KV and through contacts VD are shown in FIG. 11 in separate sections. During the production process, all perforations are produced before depositing the contact metal and the contact metal is deposited simultaneously for all contact surfaces and all through contacts.

During the isolation of the flexible circuit configurations, which are created simultaneously in the composite according to FIG. 1, they are separated again, in the variant according to FIG. 2, an adhesive force being overcome and/or a separation layer between substrate and layer sequence being dissolved. In the exemplary embodiments having substrate frame, the cutting along the contours of the individual flexible circuit configurations already results in complete separation of the individual flexible circuit configurations without further mutual coherence.

The features specified above and in the claims and the features which can be inferred from the figures can be implemented advantageously both individually and also in various combinations. The invention is not restricted to the described exemplary embodiments, but rather can be altered in many ways in the scope of knowledge in the art.

The invention claimed is:

1. A method for producing a flexible circuit configuration (FS), which contains a layer sequence and an insulating carrier film (TF), which lies flatly on the layer sequence (SF) using an inner side (TI) and is connected thereto, comprising the steps of:

depositing a layer sequence (SF) having at least one insulating layer (NF) and at least one structured conductive layer (AS) having terminal surfaces (AF), flatly connecting the insulating carrier film (TF) directly to the layer sequence (SF), creating openings (DT) in the insulating carrier film (TF) up to the terminal surfaces (AF) of the structured conductive layer (AS), creating contact surfaces (KP) directly on the outer surface (TA) of the insulating carrier film (TF), which faces away from the layer sequence (SF), and creating electrical through contacts (KD) in the openings (DT) through the insulating carrier film (TF) to connect the contact surfaces (KP) to the terminal surfaces (AF) of the structured conductive layer (AS).

2. The method according to claim 1, wherein the contact surfaces (KP) are produced on the outer surface (TA) of the insulating carrier film (TF) simultaneously with the through contacts (KD).

3. The method according to claim 1, wherein the insulating carrier film (TF) is laminated on the layer sequence (SF).

4. The method according to claim 1, wherein the insulating carrier film (TF) is at least partially formed by an adhesive film (KT).

5. The method according to claim 1, wherein the openings (DT) through the insulating carrier film (TF) are created by action of a focused laser beam.

6. The method according to claim 1, wherein the at least one conductive layer (AS) is structured, while the layer sequence (SF) is held on a rigid substrate (SW).

7. The method according to claim 6, wherein the insulating carrier film (TF) is connected to the layer sequence (SF), while the layer sequence (SF) is held unchanged on the rigid substrate (SW), and the method further comprises removing the flexible circuit configuration (FS) containing the insulating carrier film (TF) and the layer sequence (SF) from the rigid substrate (SW) after creation of the contact surfaces (KP) and through contacts (KD).

8. The method according to claim 7, wherein during the creation of the openings (DT) through the insulating carrier film (TF), a positioning reference is used that is the same as a positioning reference used for the structuring of the terminal surfaces (AF) of the at least one structured conductive layer (AS).

9. The method according to claim 6, wherein the layer sequence (SF) is created over the entire area on a substrate.

10. The method according to claim 6, wherein a base film is stretched over a frame as a rigid substrate and fastened on the frame and the layer sequence (SF) is produced at least in the area of the frame opening on the base film.

11. The method according to claim 10, wherein the base film is used as the insulating carrier film (TF), and the openings (DT) are produced in the cover layer.

12. The method according to claim 1, wherein an insulating cover layer is deposited as the layer of the layer sequence resting on the insulating carrier film (TF).

13. The method according to claim 12, wherein the cover layer is also created over the terminal surfaces of the at least one conductive layer and, during the creation of the openings (DT) in the insulating carrier film (TF), these openings (DT) are continued through the cover layer up to the terminal surfaces.

* * * * *